United States Patent [19]
Levine et al.

[11] Patent Number: 5,176,311
[45] Date of Patent: Jan. 5, 1993

[54] HIGH YIELD CLAMPLESS WIRE BONDING METHOD

[75] Inventors: Lee R. Levine, New Tripoli; Michael J. Sheaffer, Newtown, both of Pa.

[73] Assignee: Kulicke and Soffa Investments, Inc., Wilmington, Del.

[21] Appl. No.: 664,093

[22] Filed: Mar. 4, 1991

[51] Int. Cl.⁵ ............................................. B23K 31/02
[52] U.S. Cl. ..................................... 228/179; 228/4.5
[58] Field of Search ................ 228/179, 4.5, 102, 103

[56] References Cited

U.S. PATENT DOCUMENTS

| | | | |
|---|---|---|---|
| 4,234,117 | 11/1980 | Foulke | 228/4.5 |
| 4,340,166 | 7/1982 | Bilane et al. | 228/4.5 X |
| 4,444,349 | 4/1984 | Bilane et al. | 228/102 |
| 4,653,681 | 3/1987 | Dreibelbis et al. | 228/102 X |
| 4,765,531 | 8/1988 | Ricketson et al. | 228/179 |
| 5,011,061 | 4/1991 | Funatsu | 228/4.5 X |

Primary Examiner—Richard K. Seidel
Assistant Examiner—Patty E. Hong
Attorney, Agent, or Firm—John B. Sowell

[57] ABSTRACT

The present invention method is carried out with a programmable automatic wire bonder having a linear drive motor. The wire bonder is programmed to bond loose lead frame leads at a second bond position in a novel manner. The lead frame lead to be bonded at second bond is clamped in a work holder that leaves the ends of the lead frame leads loose above the bonding mandrel of the work holder but restrained to a predetermined floating zone that is established within a predetermined distance above the bonding mandrel. The bondig tool is programmed to engage the loose lead frame lead at second bond at a predetermined velocity which permits the bonding tool to simultaneously exert an impact force on the wire to be bonded and to clamp the loose lead frame lead. While the bonding tool is applying the impact force and simultaneously clamping the loose lead frame lead a second relatively high bonding force is applied to the bonding tool to complete a second bond without incurring bounce, or transient vibrations while making the second bond.

15 Claims, 4 Drawing Sheets

HIGH YIELD CLAMPLESS WIRE BONDING METHOD

BACKGROUND OF THE INVENTION

1. Field of the Invention

The present invention relates to work stations or workholders that are employed in automatic wire bonders to clamp semiconductor devices that are to be wire bonded. More particularly, the present invention relates to a novel method of bonding fine wires to the fingers or ends of leads of a lead frame to complete the second bond of a fine wire interconnection on a lead frame positioned in a quick change workholder.

2. Description of the Prior Art

The present invention relates to a substantial improvement in the method of making second bonds on the ends of leads of a lead frame held in a workholder. The prior art workholders or work stations are typical of the work station shown and described in U.S. Pat. No. 4,765,531 issued Aug. 23, 1988. This prior art improvement in workholders enabled automatic wire bonders made by Kulicke and Soffa Industries of Willow Grove, PA to consistently and uniformly make first and second bonds on semiconductor devices and such carriers as stamped lead frames. The prior art workholder has been successfully employed on automatic wire bonders designated Model 1482 to 1484 and variations thereof which are adapted to use the above mentioned quick change workholder.

Heretofore such quick change workholders of the type shown in U.S. Pat. No. 4,765,531 have employed removable or replaceable modules that are adapted to be quickly removed from the bonding machine. The removable or replaceable modules were custom designed for the many different types of semiconductor device lead frames to be bonded so as to provide precise locating and firm clamping of the ends or the fingers of the lead frames. The ends of the fingers are clamped between a lower movable heat block and a fixed and precisely planerized top plate.

Heretofore the preferred mode of wire bonding fine wire interconnections between the pads on the semiconductor device at a first bond and the ends of the leads or fingers of the lead frames at the second bond was to assure that the semiconductor and all of the ends of the leads to be bonded on the lead frame were held tight against the movable heat block which served as a mass so as to form a fixed and unyieldable mandrel so that the semiconductor and the ends of the fingers of the lead frame to be bonded were firmly clamped. To achieve the desirable type clamping of the fingers of the lead frame it was common practice in the prior art to clamp the leads as close to the ends as possible and to attempt to force the ends of the leads or fingers into engagement with the heat block to assure that the finger was tightly clamped so as to prevent any looseness and to transfer heat from the heat block to the ends of the fingers to be bonded. Proper thermosonic wire bonds at first and second bonding sites are a function of time, force and ultrasonic power applied through the bonding tool to the wire being bonded. Heating the semiconductor device pads and/or the lead frame fingers is known to reduce the bonding time. Alternatively the raising of the temperature of the bonding target has been employed to reduce the required bonding force to make high yield strong bonds. It is known that the application of an ultrasonic scrub motion to the bonding tool during first and second bond further reduces the bonding time and/or may be used to reduce the bonding force at first and second bond.

Very high lead count lead frames are used with very large scale integration (VLSI) semiconductor devices. Such high count lead frames require that the lead frame fingers be made very small to prevent touching adjacent leads and to provide the necessary number of leads for making interconnections from the lead out pads at the outer perimeter of the high density VLSI semiconductor devices. Not only have the fingers of the lead frame been made smaller but they are positioned further from the bonding targets on the semiconductor devices so that the fine wire interconnection must be made more accurately than in the prior art and the shape of the loop of the interconnecting fine wires must be more precise than was heretofore necessary.

One of the problems which has existed with prior art workholders is that they are extremely expensive and must be custom designed for the many different types and sizes of lead frames to assure proper clamping.

It would be extremely desirable to provide a method and apparatus for making fine wire interconnections on high density semiconductor devices using inexpensive clampless workholders and programmable automatic wire bonders of the type that may be reprogrammed to carry out a new and improved bonding method.

SUMMARY OF THE INVENTION

It is a principal object of the present invention to provide a new method of making second bonds on the fingers or leads of a lead frame that are purposely not clamped between a top plate and a heat block of a workholder.

It is a principal object of the present invention to provide a novel method of making high yield second bonds on lead frame leads that have large dimensional differences between lead frames due to the different manufacturing processes and/or different materials supplied by different manufacturers.

It is a principal object of the present invention to provide an apparatus for making consistently perfect fine wire interconnections between the pads on a semiconductor device and the ends of leads of a lead frame.

It is another object of the present invention to provide a method of making consistently perfect second bonds on the ends of lead frame fingers of a lead frame in a minimum amount of time.

It is another object of the present invention to provide a modified lead frame clamping apparatus which is cheaper to manufacture than prior art lead frame workholders and clamps presently being employed for clamping high density devices.

It is another object of the present invention to provide a modified lead frame workholder that does not require clamping of the ends of the leads of a lead frame to be bonded at second bond.

It is another object of the present invention to detect the presence of lead frame leads that are positioned a predetermined distance above the heat block or mandrel when making second bonds and to use this information when producing the tail above each lead after making a second bond.

It is another object of the present invention to calculate a new vertical height position for positioning the bonding tool after making a second bond so as to produce equal lengths of tails prior to producing a ball at the end of the wire used for the next first bond.

According to these and other objects of the present invention, there is provided an automatic wire bonder that is programmable to perform consistent second bonds on the ends of the fingers of lead frames that have been positioned a predetermined distance above a heat block. The ends of the leads where second bonds are to be made are held in a clampless workholder that positions the leads in a known corridor or floating zone above the workholder. The bonding tool of the automatic wire bonder is actuated in a manner so as to first detect the floating lead and subsequently to clamp the floating lead against a heat block with a known impact force and then to perform a second bond using a relatively high bonding force.

DESCRIPTION OF THE PREFERRED EMBODIMENT

Figure 1:
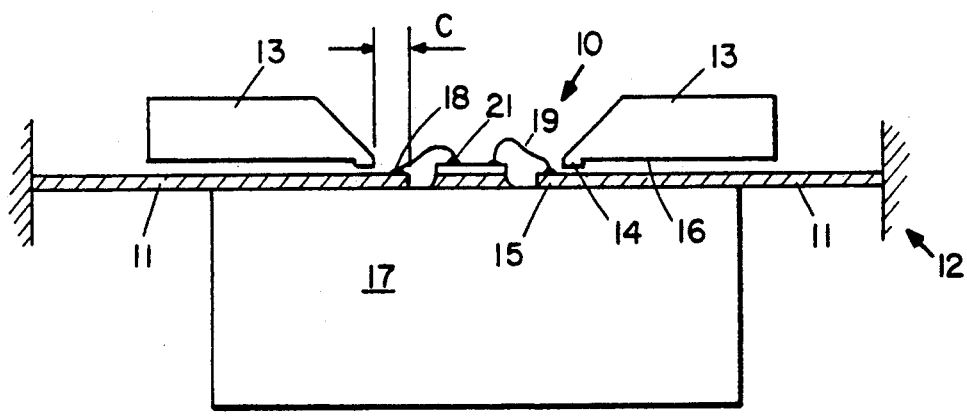
FIG. 1 is an enlarged section in elevation of a bonded lead frame held in a prior art type workholder.

Refer now to FIG. 1 showing an enlarged section in elevation of a bonded lead frame 11 positioned in the guides 12 of a workholder 10. The top plate 13 of workholder 10 is shown having a downward extending protrusion 14 which extends around the perimeter of the ends 15 of the lead frame fingers. In a preferred embodiment prior art workholder, the distance C from the ends of the fingers 15 to the protrusion 14 has been approximately 40 mils which is about as close a distance as can be achieved in a precision top plate and still permit sufficient access for a bonding tool.

It will be noted that the bottom face 16 of the top plate 13 is well removed from the lead frame 11. Heat from the movable heat block 17 is readily transmitted into the finger 15 of the lead frame 11 in a manner which reduces the bonding force and/or the bonding time required for making the second bond 18 on the lead frame lead 15. The fine wire interconnection 19 forms a predetermine profile or loop that is a function of the path taken by the bonding tool when moving from first bond 21 to second bond 18.

The prior art workholder and clamp shown in FIG. 1 has been successfully employed for making fine wire interconnections between low lead count devices and low lead count lead frames to medium lead count lead frames.

Figure 2:
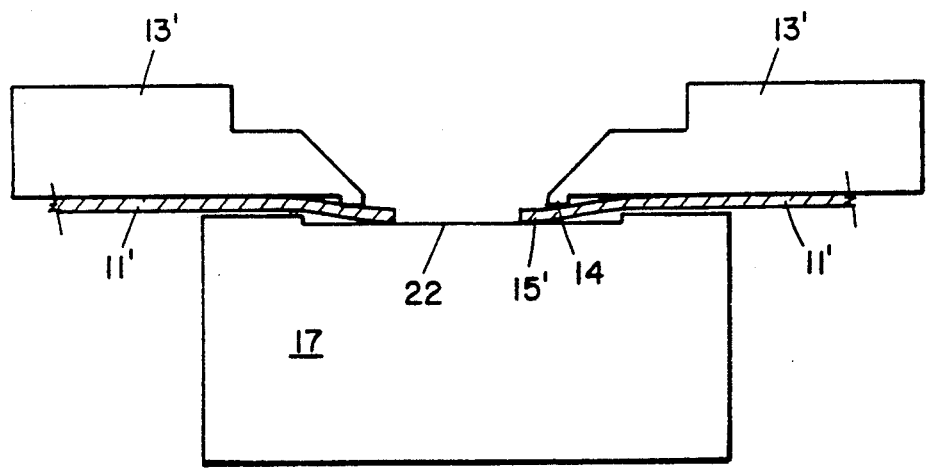
FIG. 2 is an enlarged section in elevation of a lead frame held in a positive clamping type prior art workholder.

Refer now to FIG. 2 showing an enlarged section in elevation of a lead frame being held in a positive clamping prior art workholder clamp. The top plate 13' is provided with downward protrusions 14' which extends further than the protrusion 14 described in FIG. 1. The heat block or mandrel 17' is provided with a recess 22 which enables the protrusion 14' to deform or bend the ends of the lead frame lead 15' downward so as to engage the top surface of the recess 22, thus, assuring a positive clamping action for perfect bonding. The problem that exists with the clamp used for perfect bonding shown in FIG. 2 is that top plate 13' and heat block 17' must be made with great precision which can only be accomplished through relatively high machining costs. The positive clamping workholder shown in FIG. 2 has been employed with high lead count lead frames to make successful high yield fine wire interconnections and second bonds. Such workholder clamps are usually designed for each unique semiconductor device to be bonded.

Figure 3:
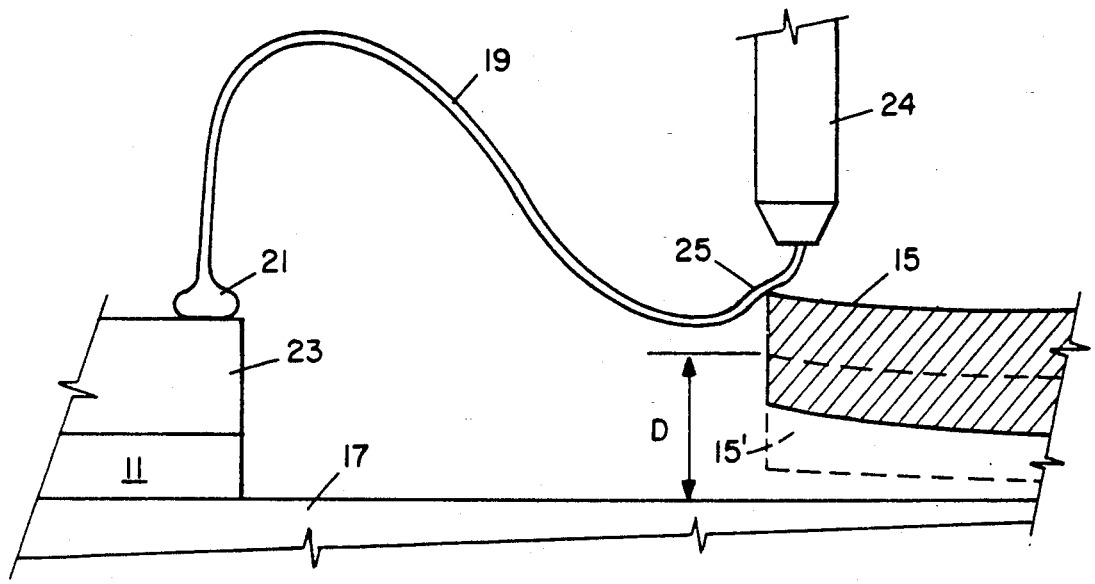
FIG. 3 is a substantially enlarged elevation of a fine wire inner connection being made between a pad on a semiconductor device and the uncontrolled loose end of a lead frame lead.

Refer now to FIG. 3 showing a substantially enlarged elevation of a fine wire interconnection being made between a pad on a semiconductor device and the uncontrolled loose end of a lead frame lead. The fine wire interconnection 19 is shown having a proper first bond 21 on the target or electrode pad of a semiconductor 23. The movement of the bonding tool 24 has been programmed to produce a desired profile or loop. When the lead 15 is permitted to rise above the distance D, the fine wire 19 at point 25 touches the lead 15 and forms a kink in the wire at point 25 as well as deforming the desired profile of the interconnecting wire loop 19. If the lead 15' shown in phantom lines does not exceed the floating height D, the interconnecting loop can be made to a desired and predetermined profile. Heretofore, when the lead 15 has been permitted to float above the top of the mandrel or heat block 17 the second bond 18 is not made uniformly. Either the second bond is loose or unattached which is known as a missed bond or the full strength of the bond made at second bond is not as strong as a perfect bond made when the lead 15 is clamped perfectly against the mandrel 17. The present invention method which will be explained in greater detail hereinafter is capable of making perfect bonds on loose lead frame leads 15' which extend in a floating zone shown by dimension D above the top surface of the heat block or mandrel 17. Through experimentation it has been found that the floating zone may be controlled so as to avoid kinks and deformation of the interconnecting wire 19 and to produce consistent and perfect second bonds 18 even though the lead 15' is permitted to float in a floating zone of dimension D. The floating zone for a typical high lead count or high density lead frame that is up to 10 mils thick is in the order of 8 or 9 mils.

Figure 4:
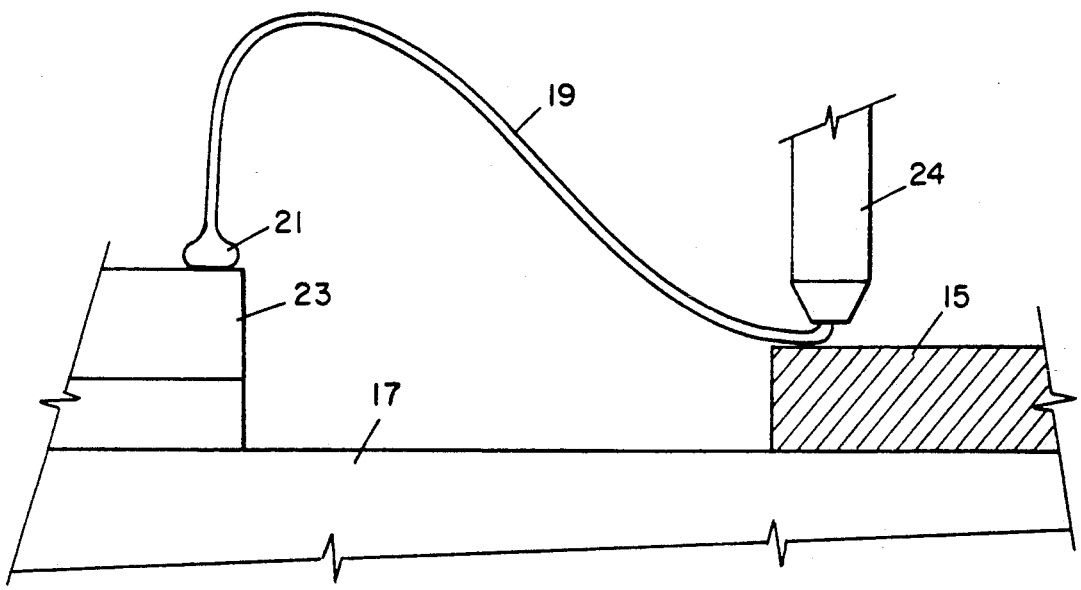
FIG. 4 is another substantially enlarged elevation of a fine wire interconnection being made between a pad on a semiconductor device and the controlled loose end of a lead frame lead.

Refer now to FIG. 4 showing a substantially enlarged elevation of a fine wire interconnection being made between a pad on a semiconductor device 23 and the controlled loose end or lead 15 of a lead frame 11. The bonding tool 24 is shown shortly before the start of the second bond and at the time the downward movement of the bonding tool has started to clamp the loose lead 15 against the top surface of the mandrel 17. As will be explained in greater detail hereinafter the novel preferred embodiment method will detect the engagement of the fine wire 19 with the floating lead 15 even though the floating lead offers little or no resistance to the movement of the bonding tool 24. In the preferred embodiment of the present invention, the bonding tool engages the lead 15 with a clamping force rather than a very high impact bonding force and subsequently increases the bonding force of the bonding tool 24 to the range of bonding forces acceptable for making second bonds.

Figure 5:
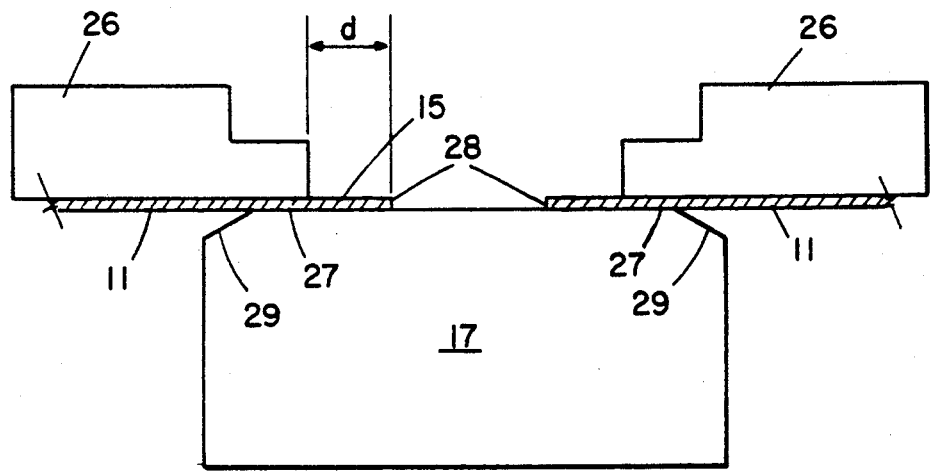
FIG. 5 is an enlarged section an elevation of a lead frame lead that is clamped at a position remote from the ends of the lead frame leads.

Refer now to FIG. 5 showing an enlarged section in elevation of a preferred embodiment workholder that clamps the lead frame lead to be bonded at a position remote from the end of the lead frame lead. The top plate 26 is shown positioned a substantial distance d from the end of the lead 15. The distance may vary from workholder to workholder but a distance of 50 mils to 300 mils has been found to cover a large range of workholders for high lead count devices. The distance d may be increased or decreased so as to restrict the floating zone D shown in FIG. 3 to no more than 8 or 9 mils as described hereinbefore. The bottom surface of the top plate 26 is flat and is fixed in space by the supporting parts of the workholder (not shown) in a plane which is parallel to the top surface of the heat block 17 and is orthogonal or perpendicular to the Z axis of vertical movement of the bonding tool 24. When the top plate 26 is held in a fixed plane the vertical upward movement of the heat block 17 is permitted to conform its peripheral edges 2 to the bottom surface of the top plate 26 with the lead frame 11 clamped therebetween. Even though the lead 15 is clamped remote from its end 28, sufficient heat from the heat block is transferred into the lead frame 15 to enhance the making of a second bond. However, being removed a distance d from the end 28, the top plate 26 is ineffective to exert a downward pressure on the end 28 of the lead 15. In fact the lead 15 even though appearing to be substantially flat has been found to vary in flatness or curvature so that few if any of the leads 15 are tightly clamped against the mandrel 17 by the preferred embodiment workholder shown in FIG. 5. Having recognized the difficulty in effecting a perfect clamping condition at the end 28 of the lead 15, the present invention method assumes that all of the leads 15 are floating and performs a clamping operation using the tool 24 to clamp the lead 15 as was shown and described with reference to FIG. 4. It will be noted that the surfaces of the top plate 26 and the heat block 17 are flat surfaces which are easily and economically obtained. The beveled or taper 29 on the heat block 17 serves the useful purpose of restricting the area 27 of heat transfer into the leads 15 to the desired end of the lead where the second bond is to be made and may not be required for heat blocks and lead frames 11 where the transmission of heat is not a problem. It has been found that maintaining the distance d within the range of 50 mils to 300 mils will prevent well formed leads 15 from rising more than 8 or 9 mils. If the leads to be bonded exceed these dimensions, either the lead frame leads may be reformed by coining or the distance d may be reduced to assure that the floating leads do not extend beyond the desired floating zone.

Figure 6:
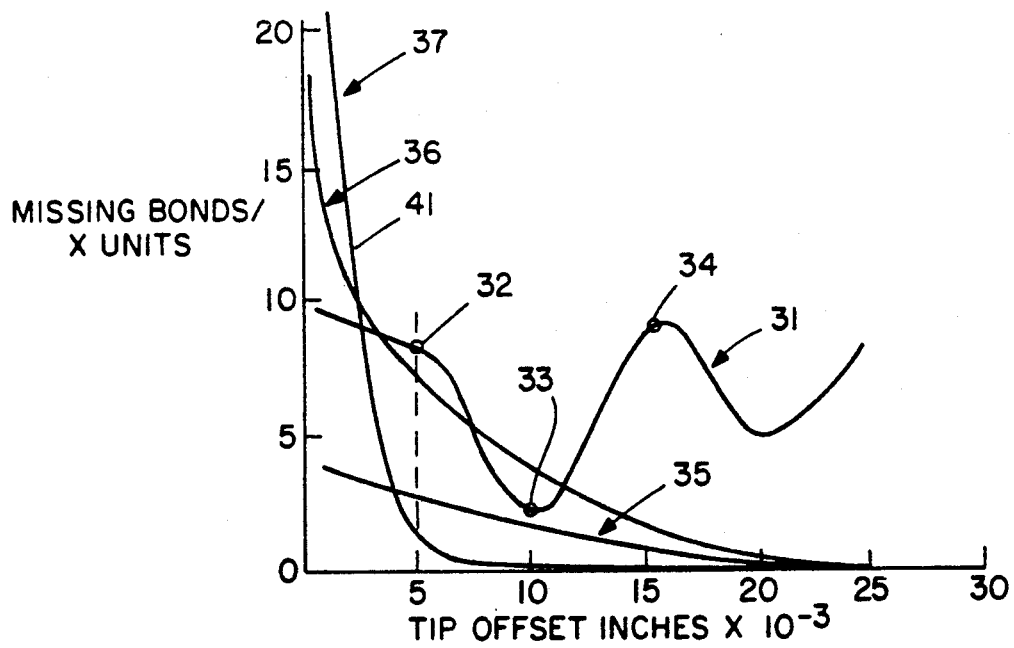
FIG. 6 is a schematic wave form diagram showing the height of the bonding tool tip offset versus the number of bond defects produced for a plurality of bonding tool velocities.

Refer now to FIG. 6 showing schematically a wave form diagram which illustrates how the bonding tool tip offset dimension influences the number of bond defects or improper bonds for different velocities of the bonding tool when it is used for clamping the loose lead frame lead 15. The FIG. 6 curves were made by maintaining a constant velocity downward movement of the bonding tool 24 from different inflection points or heights shown. The setting of tip offset or inflection points is shown and described in U.S. Pat. No. 4,340,166 which is assigned to Kulicke and Soffa Industries Inc. and is used in their automatic wire bonders. Curve 31 was made at a velocity of 0.6 inches per second from a series of different tip offset dimensions. The point 32 on curve 31 illustrates that low dimensions of tip offset produce a high number of bond defects. Raising the tip offset to 10 mils initially reduced the number of bond defects as shown at point 33. However, continuing to raise the tip offset dimension from 10 mils to approximately 15 mils again increases the number of bond defects to point 34 which is 25 again lowered by increasing the offset dimension to 20 mils. A critical analysis of curve 31 illustrates that some oscillation or seeking is occurring in the system at low velocities and such low velocities should be avoided. When the velocity of the bonding tool 24 was increased to 1.2 inches per second as shown by wave form 35, the number of bond defects consistently and uniformly decrease with an increase in tip offset so that no defects were observed after a tip offset dimension of 25 mils. Similarly, when the velocity of the bonding tool 24 was increased to 1.5 inches per second as shown by wave form 36 the number of defects rapidly decreased until no improper bonds were observed at a tip offset height of approximately 25 mils. When the bonding tool velocity was increased to 1.8 inches per second as shown at wave form 37, the number of defects rapidly decreased to zero for a tip offset dimension slightly greater than 5 mils. Due to inherent limitations in the automatic wire bonders it is not deemed desirable to decrease the tip offset dimension less than 5 mils and even though higher velocities of the bonding tool could be employed they would not be required to further reduce the number of bond defects achievable with a velocity of 1.8 inches per second. This is to say that higher velocities up to double 1.8 inches per second are operable but tip offset dimensions below 5 mils are not recommended. The actuation of the bonding tool 24 at different constant velocities was accomplished employing the aforementioned Model 1484 Kulicke and Soffa Industries automatic wire bonder which had been fitted with a bonding head of the type having a linear motor which permits control of velocity and force on the bonding tool by control of the current applied to the linear motor of the type shown in U.S. Pat. No. 4,653,681 also assigned to Kulicke and Soffa Inc.

Figure 7:
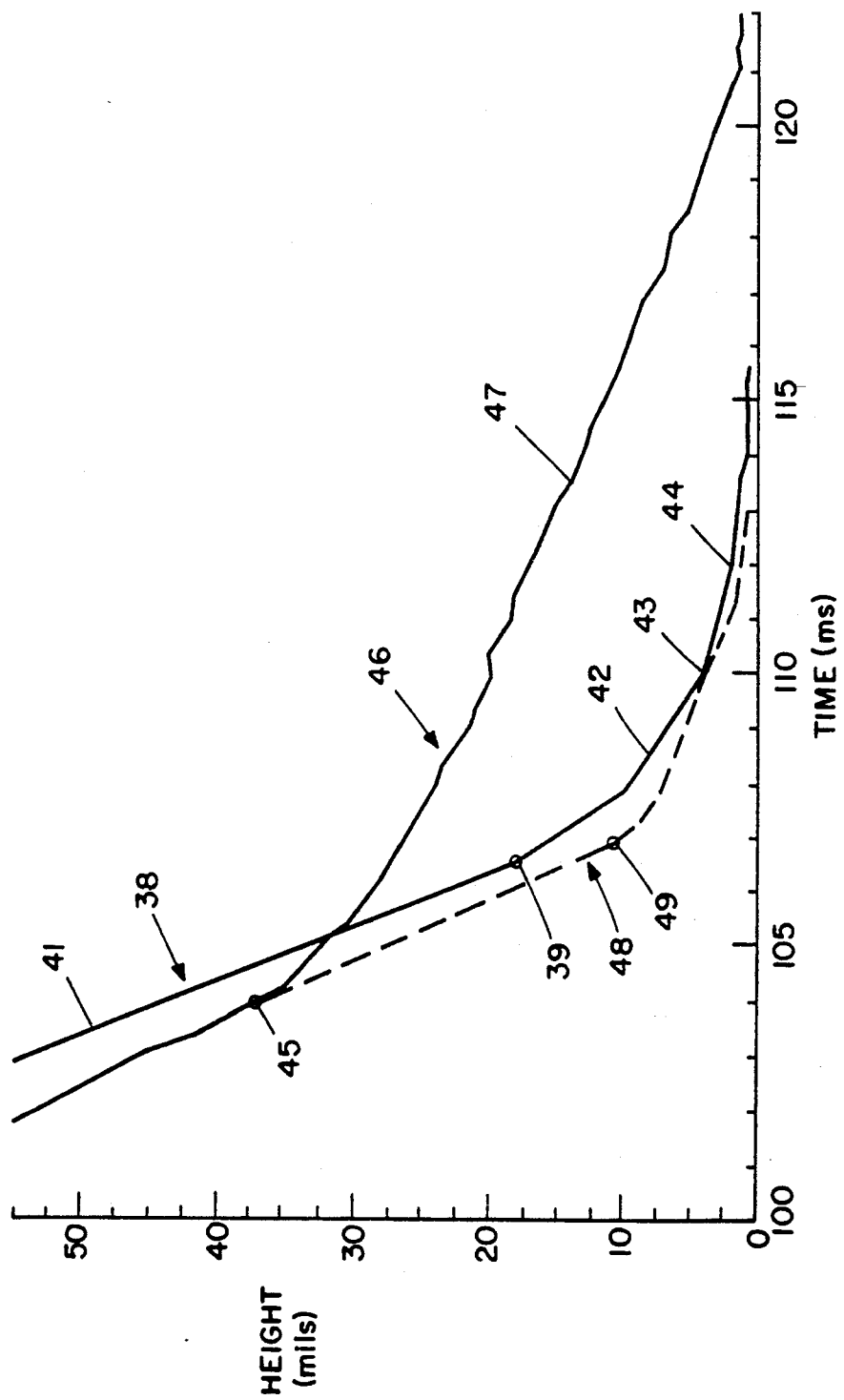
FIG. 7 is a schematic wave form diagram showing the preferred bonding tool velocity profile for the novel loose clamp method of making second bonds on floating lead frame leads.

Refer now to FIG. 7 showing a schematic wave form diagram illustrating a preferred bonding tool velocity profile for use with the novel loose clamping method of making second bonds. The ordinate of FIG. 7 represents the height of the bonding tool in mils and the abscissa of FIG. 7 represents the time in milliseconds for the vertical descent of the bonding tool at second bond. Wave form 38 represents a preferred prior art bonding curve in which the inflection point 39 attempts to change the high velocity portion 41 of curve 38 to a low constant velocity of approximately 0.6 inches per second. Points 42 through 44 clearly illustrate that the change from high velocity to low velocity cannot be easily accomplished in one or two milliseconds. While it is possible electronically to generate signals to the linear motor to change velocity from a high velocity to a low velocity, the inherent inductive reactance and impedance in the electrical or electromechanical system continues to make velocity changes for several milliseconds which extend down to the time the bonding tool has engaged a lead frame lead 15. Since the velocity of the bonding tool for wave form 38 is very low or comparatively low, the impact force of the bonding tool on the lead frame lead and the wire being bonded is very small and may not be consistent. However, when the tip offset point 45 of wave form 46 is increased to a value around 30 mils the linear motor of the automatic wire bonder is capable of entering a substantially constant velocity mode of operation which extends from 105 milliseconds to 121 milliseconds in FIG. 7. The constant velocity portion 47 of wave form 46 was made at 1.8 inches per second and is comparable with wave form 37 shown in FIG. 6. Wave form 37 clearly shows that the tip offset height of curve 46 may be reduced to approximately 10 mils and still be assured that no bond defects will occur. Wave form 46 has been modified using the information shown on FIG. 6 to produce wave form 48 shown in phantom lines having a tip offset point 49 approximately 10 mils in height.

The combination of FIGS. 6 and 7 clearly illustrate that any automatic bonding machine can be monitored to determine the proper velocity of the bonding tool to assure the absolute minimum number of improper bonds and the preferred and safe tip offset height for entering the preferred constant velocity mode. While making this determination it is then possible to restrict the floating height of the leads 15 of a lead frame so that it may be clamped by the bonding tool 24 prior to performing the second bond which is preferably performed as a continuing sequence of movements of the bonding tool in which a high bonding force is applied to the bonding tool to make the second bond. As explained hereinbefore, increasing the temperature of the lead frame lead and/or increasing the bonding force on the bonding tool as second bond decreases the bonding time required to make perfect second bonds. By only increasing the constant velocity at the point of impact to a velocity which assures a low tip offset point and no improper bonds, it is now possible to control the making of second bonds with clampless workholders of the type shown in FIG. 5 which are easily manufactured at minimum expense and without need for high precision.

Another feature of the present invention is to monitor the back EMF of the linear motor of the type shown in U.S. Pat. No. 4,653,681 and set a threshold value high enough to determine when the bonding tool first makes contact with the lead 15 as shown in FIG. 3. Since the floating zone shown by the dimension D in FIG. 3 is held below the point where the fine wire 19 would be kinked by the lead 15, the condition shown in FIG. 4 will always occur even though the lead 15 may be floating. Having detected the floating height of the lead shown in phantom lines in FIG. 3, it is possible to record this height in the processor of the automatic wire bonder. By setting a second threshold value it is also possible to determine when the bond tool 24 has engaged the floating lead 15 against the mandrel or heat block 17 as shown in FIG. 4. In the preferred embodiment of the present invention, it is possible to actuate the second bonding force current applied to the linear motor when the floating lead 15 is first detected because there is some inherent delay due to impedance and inductive reactance in the linear motor so that the second bonding force may be applied shortly after or simultaneously with the impact force and clamping force of the bonding tool 24 on lead 15 as shown in FIG. 4. Delays of up to 20 milliseconds have been observed.

After the second bond is made on a floating lead 25 and the bonding tool 24 is raised to a predetermined height to pay out a short length of fine wire above the second bond, the floating lead 15 may follow the bonding tool so that the tail length produced at the second bond may vary from lead to lead. By setting the threshold value for the linear motor high enough to detect the contact with the floating lead 15 it is now possible to raise the bonding tool 24 above this prerecorded distance and always pay out the same length of fine wire above the second bond prior to clamping the wire and pulling the wire to sever the wire at the second bond as is well known in the bonding art. The setting of a second and higher threshold back EMF to detect when the bonding tool 24 has clamped the lead 15 against the mandrel 17 only insures that the high bonding force applied at second bond is not prematurely applied which could create a condition known as bounce, dither or vibrations.

Having explained a preferred embodiment of the present invention it will now be appreciated that the yields of very expensive high count devices may now be bonded at first and second bond with inexpensive workholders using a method which assures that the second bond will always be firmly attached to the ever decreasing size lead 15 of the lead frames for high count devices (which are very expensive). It is no longer necessary to slow down the bonding process to assure perfect second bonds when the present invention method and apparatus is employed. Thus, there is a synergistic effect of decreasing the bonding time at second bond while insuring or increasing the production of high yield second bonds employing workholders which are both easier and cheaper to make.

What is claimed is:

1. A method of bonding loose lead frame leads at a second bond position of a lead frame, comprising the steps of:

mounting a lead frame having a semiconductor device thereon to be wire bonded on the ends of the lead frame leads at the second bond position in a workholder of an automatic wire bonder, initially clamping said lead frame leads in a workholder in a manner which permits the ends of the lead frame leads to rise loose above the bonding mandrel of said workholder, restraining all of the loose ends of the lead frame leads to be bonded to a floating zone established a short predetermined distance above said bonding mandrel, moving the bonding tool of the automatic wire bonder into engagement with a lead frame lead to be second wire bonded in a predetermined linear velocity mode of operation without transient seeking, engagingly clamping said loose lead frame leads against said bonding mandrel with said bonding tool at said predetermined linear velocity, and simultaneously applying a predetermined second bond bonding force to complete a second wire bond on said loose lead frame lead.

2. A method of bonding loose lead frame leads as set forth in claim 1 wherein said automatic wire bonder is provided with a linear motor for moving said bonding tool, and further includes the step of:

sensing the back electromotive force (EMF) of said linear motor to instantaneously determine the point when said bonding tool has begun to engagingly clamp said loose lead frame lead and said step of applying a predetermined second bond bonding force comprises the step of:
  rapidly increasing the current applied to said linear motor to effect said second bonding force and to simultaneously clamp and bond said loose lead frame lead.

3. A method of bonding loose lead frame leads as set forth in claim 2 which further includes the step of:
  setting a threshold level EMF for the step of sensing the back EMF of said linear motor, and
  comparing said threshold level EMF with the back EMF of said linear motor to determine when said bonding tool has begun to clamp said loose lead frame lead.

4. A method of bonding loose lead frame leads as set forth in claim 3 wherein the step of moving the bonding tool in a predetermined linear velocity mode comprises the step of:
  initiating said linear velocity mode of said bonding tool up to 20 milliseconds before initiating said second bond bonding force.

5. A method of bonding loose lead frame leads as set forth in claim 4 wherein said step of initiating said linear velocity mode of said bonding tool includes the step of:
  delaying the actuation of said second bond bonding force a predetermined time after detecting said threshold level EMF.

6. A method of bonding loose lead frame leads as set forth in claim 1 which further includes the step of selecting a desired predetermined linear velocity for movement of said bonding tool to effect said engagingly clamping of said loose lead frame lead which is within a range of predetermined velocities that have been determined to eliminate open bonds being made by said automatic wire bonder.

7. A method of bonding loose lead frame leads as set forth in claim 6 wherein said step of selecting said desired predetermined linear velocity includes selecting a velocity greater than 1.0 inches per second.

8. A method of bonding loose lead frame leads as set forth in claim 7 wherein said step of selecting said desired predetermine linear velocity includes selecting a velocity of less than approximately 3.6 inches per second.

9. A method of bonding loose lead frame leads as set forth in claim 7 wherein said selected velocity is sufficient to create an impact force for deforming the wire under said bonding tool prior to making said second wire bond.

10. A method of bonding loose lead frame leads as set forth in claim 1 which further includes the step of sensing the point in space where a loose lead frame lead is located above said bonding mandrel,
  recording said point in space in said automatic wire bonder, and
  raising the bonding tool a predetermined distance above said point in space to pay out an exact predetermined length of wire after making said second wire bond to provide an exact length of wire as a tail for the next wire bond.

11. A method as set forth in claim 10 wherein said step of sensing the point in space where said loose lead frame lead is located comprises,
  setting a first threshold back EMF for the bonding tool linear drive motor, and
  sensing when the back EMF of said linear drive motor reaches said first threshold level which is indicative of the bonding tool touching a loose lead frame lead.

12. A method as set forth in claim 11 wherein the step of moving said bonding tool into engagement with a lead frame lead further includes,
  setting a second threshold back EMF for the bonding tool linear drive motor at a level higher than said first threshold level EMF, and
  sensing when the back EMF of said linear drive motor reaches said second threshold EMF which is indicative of the bonding tool engaging the lead frame lead against said bonding mandrel.

13. A method of bonding loose lead frame leads as set forth in claim 1 wherein said step of clamping said lead frame lead comprises clamping said lead frame lead at a point well removed from the ends of the lead frame lead so that none of the ends of the lead frame leads are tightly engaged against said bonding mandrel.

14. A method of bonding loose lead frame leads as set forth in claim 13 wherein said lead frame leads are clamped at a point approximately 50 mils to 300 mils from the ends of said leads.

15. A method of bonding loose lead frame leads as set forth in claim 13 wherein the said step of restraining the loose ends of said lead frame leads to a floating zone comprises the step of:
  creating a floating zone distance up to 9 mils in which all leads of said lead frame are located.

* * * * *